(12) United States Patent
Wiltse et al.

(10) Patent No.: US 10,358,722 B2
(45) Date of Patent: Jul. 23, 2019

(54) SHOWERHEAD ASSEMBLY

(71) Applicant: Lam Research Corporation, Fremont, CA (US)

(72) Inventors: John Wiltse, Lake Oswego, OR (US); Damien Slevin, Salem, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 556 days.

(21) Appl. No.: 14/967,672

(22) Filed: Dec. 14, 2015

(65) Prior Publication Data

US 2017/0167024 A1    Jun. 15, 2017

(51) Int. Cl.
  *C23C 16/455*    (2006.01)
  *H01J 37/32*     (2006.01)
(52) U.S. Cl.
  CPC .. *C23C 16/45565* (2013.01); *C23C 16/45574* (2013.01); *H01J 37/3244* (2013.01)
(58) Field of Classification Search
  USPC .................. 156/345.33, 345.34; 118/715
  See application file for complete search history.

(56) References Cited

U.S. PATENT DOCUMENTS

| | | | |
|---|---|---|---|
| 6,860,965 B1 | 3/2005 | Stevens | |
| 8,840,754 B2 | 9/2014 | Hao | |
| 2006/0228496 A1* | 10/2006 | Choi | H01J 37/3244 |
| | | | 427/569 |
| 2012/0222815 A1* | 9/2012 | Sabri | C23C 16/45565 |
| | | | 156/345.34 |

* cited by examiner

*Primary Examiner* — Rudy Zervigon
(74) *Attorney, Agent, or Firm* — Buchanan Ingersoll & Rooney PC

(57) ABSTRACT

A face plate of a showerhead assembly of a deposition apparatus in which semiconductor substrates are processed includes gas holes arranged in an asymmetric pattern with a hole density which is substantially uniform or varies across the face plate. The face plate can include a lower wall and an outer wall extending vertically upwardly from an outer periphery of the lower wall. The outer wall is sealed to an outer periphery of a back plate such that an inner plenum is formed between the face plate and the back plate. The gas hole pattern in the face plate avoids symmetry which can cause defects on processed substrates.

20 Claims, 11 Drawing Sheets

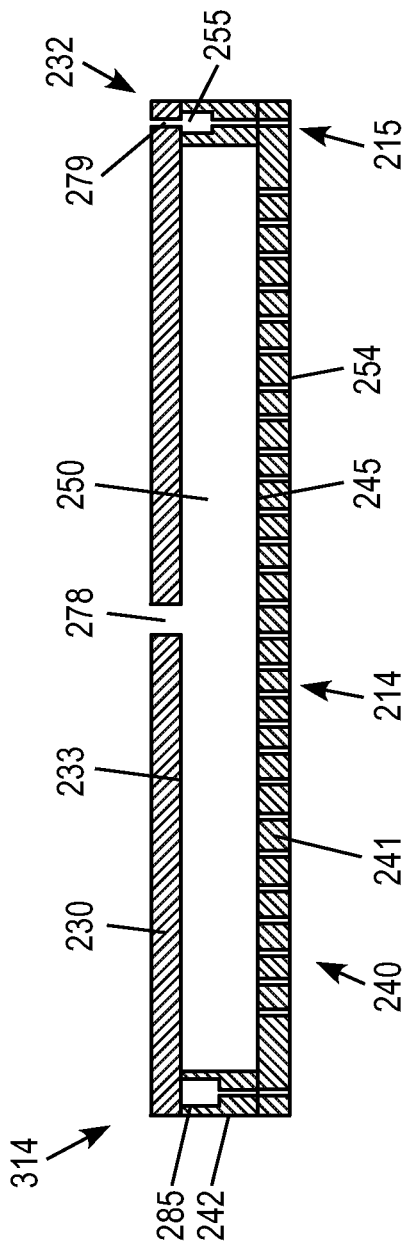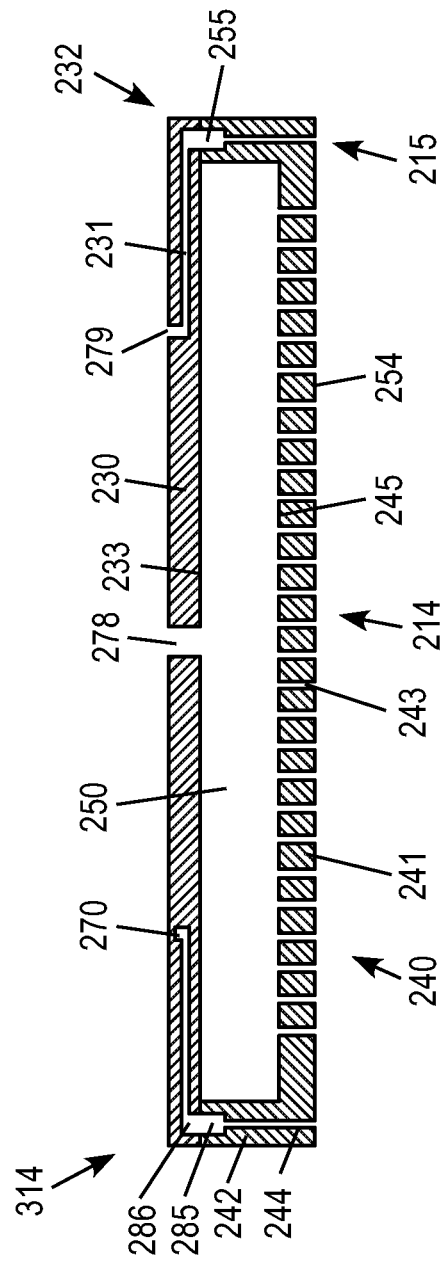

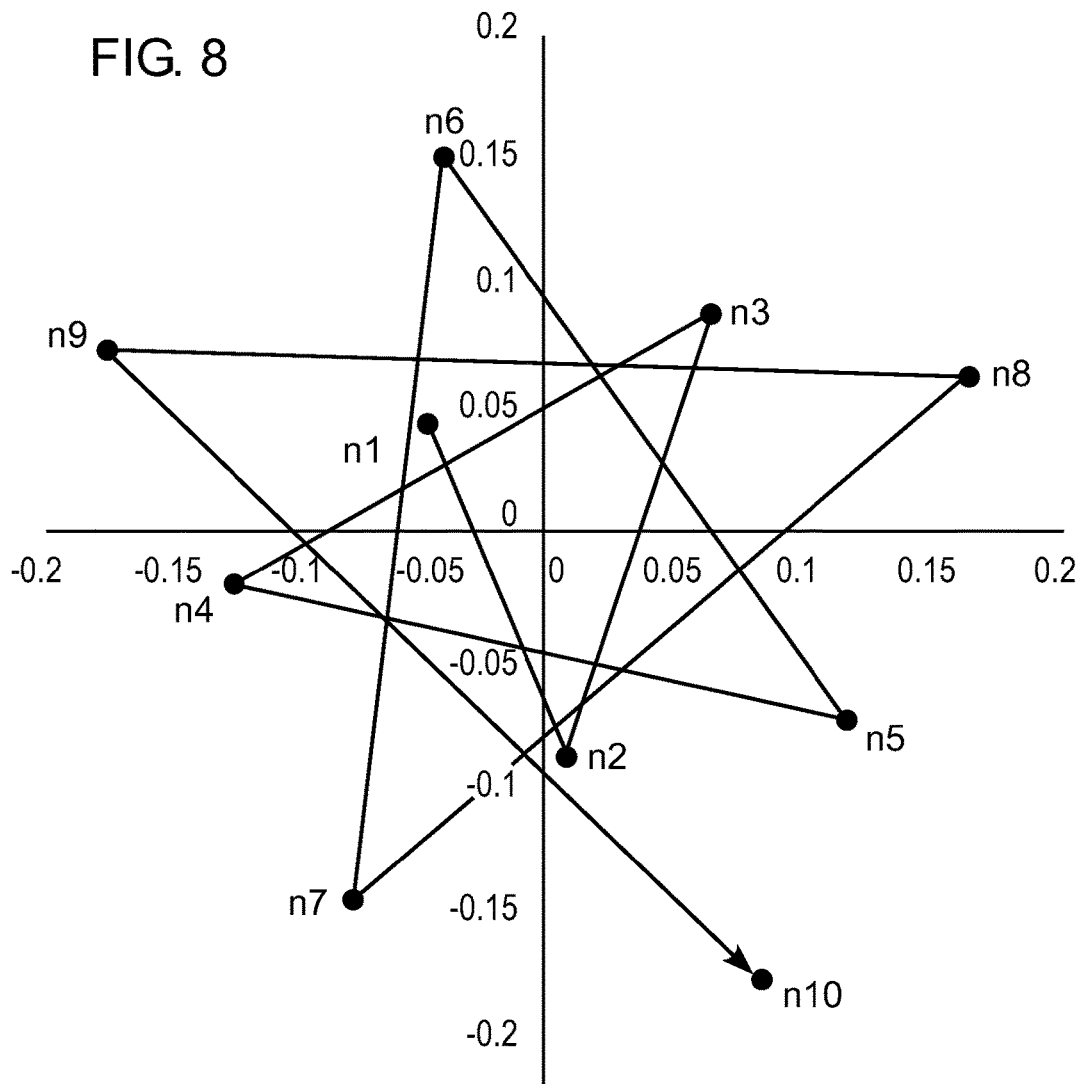

SHOWERHEAD ASSEMBLY

FIELD OF THE INVENTION

This invention pertains to substrate processing apparatuses for processing substrates, and may find particular use in plasma-enhanced chemical vapor depositions processing apparatuses operable to deposit thin films.

BACKGROUND

Substrate processing apparatuses are used to process substrates, such as semiconductor, glass, or polymer substrates, by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of substrate processing apparatus is a plasma processing apparatus that includes a reaction chamber containing upper and lower electrodes wherein a radio frequency (RF) power is applied between the electrodes to excite a process gas into plasma for processing substrates in the reaction chamber.

SUMMARY

Disclosed herein is a face plate of a showerhead assembly of a deposition apparatus for processing substrates. The face plate includes gas holes arranged in an asymmetric pattern to achieve uniform film deposition and avoid particle defects caused by symmetrical hole patterns.

Also disclosed herein is deposition apparatus including the showerhead assembly and a method on manufacturing the face plate.

Further disclosed herein is a method of depositing material on an upper surface of a substrate in a deposition apparatus incorporating the showerhead assembly.

BRIEF DESCRIPTION OF THE DRAWING FIGURES

FIG. 2A illustrates an embodiment of a showerhead assembly of a deposition apparatus as disclosed herein.

FIG. 2B illustrates an embodiment of a showerhead assembly of a deposition apparatus as disclosed herein.

FIG. 8 illustrates a hole pattern according to the Vogel equation.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

Disclosed herein is a showerhead assembly that is operable to deliver process gas into a vacuum chamber and form uniform films on semiconductor substrates. As used herein gas includes one or more gases or vapors, and/or gas/vapor mixtures. The showerhead assembly includes an inner plenum in fluid communication with at least one gas source operable to supply a process gas, tuning gas, purge gas, and/or combination thereof. Preferably, the gas source is operable to supply a gas (e.g., gaseous or vapor mixture) which may be energized into plasma in a vacuum chamber of a deposition apparatus such that a plasma deposition process may be performed on an upper surface of a substrate.

Figure 1:
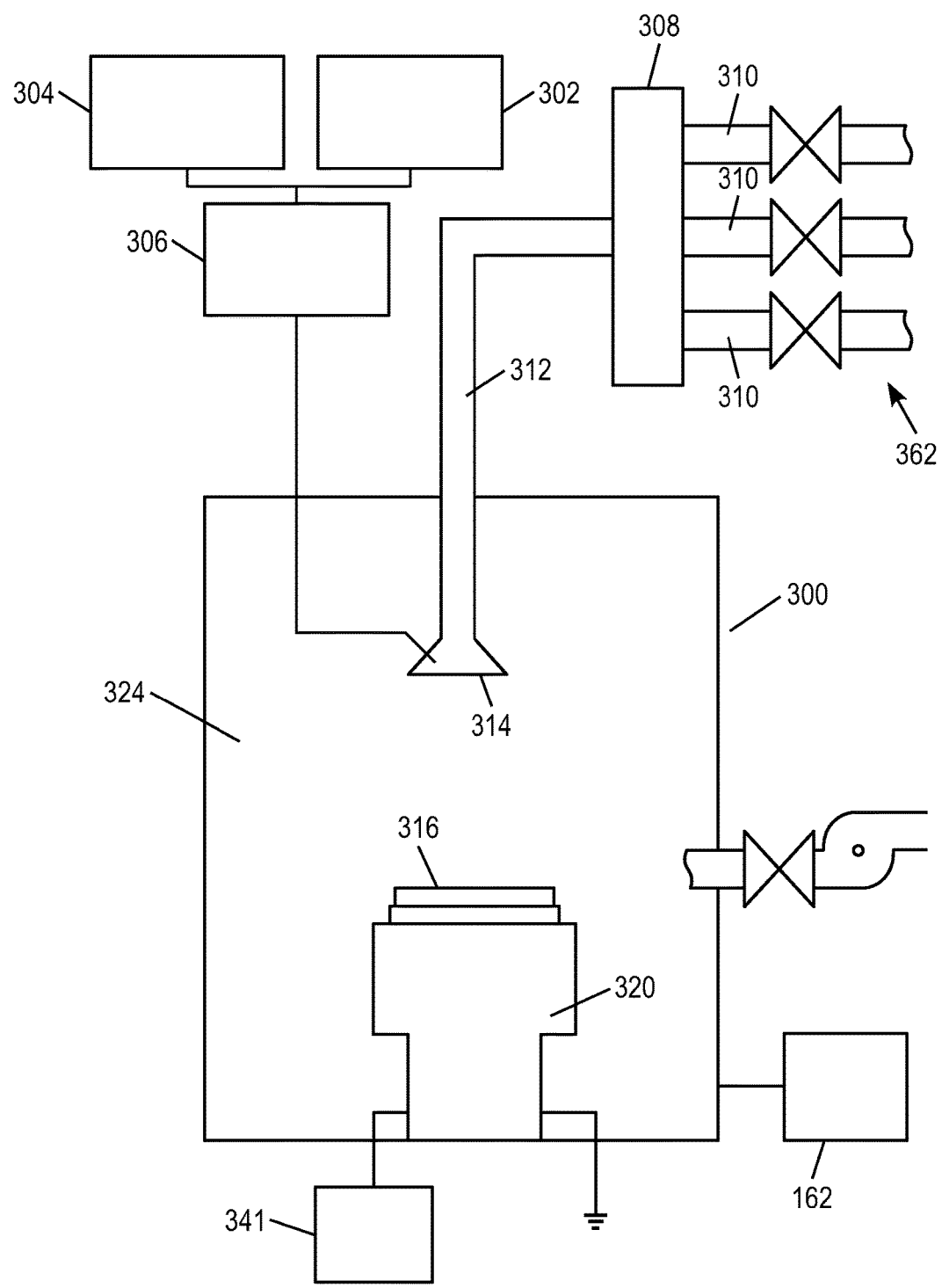
FIG. 1 illustrates a schematic diagram showing an overview of a deposition apparatus in accordance with embodiments disclosed herein.

Embodiments disclosed herein are preferably implemented in a deposition apparatus such as a plasma-enhanced chemical deposition apparatus (i.e. PECVD apparatus, PEALD apparatus, or PEPDL apparatus), however, they are not so limited. FIG. 1 provides a simple block diagram depicting various substrate plasma processing apparatus components arranged for implementing embodiments as disclosed herein. As shown, a substrate plasma processing apparatus 300 includes a vacuum chamber 324 that serves to contain plasma in a processing zone, which is generated by a capacitor type system including a showerhead assembly 314 optionally having an upper RF electrode (not shown) therein working in conjunction with a substrate pedestal assembly 320 having a lower RF electrode (not shown) therein. At least one RF generator is operable to supply RF energy into a processing zone above an upper surface of a substrate 316 in the vacuum chamber 324 to energize gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead assembly 314 such that RF energy may be supplied to the processing zone above the substrate 316 in the vacuum chamber 324.

The power and frequency of RF energy supplied by matching network 306 to the interior of the vacuum chamber 324 is sufficient to generate plasma from the gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of gas, may depend on the free volume of the vacuum chamber or processing zone.

An upper surface of the substrate pedestal assembly 320 supports a substrate 316 during processing within the vacuum chamber 324. The substrate pedestal assembly 320 can include a chuck to hold the substrate and/or lift pins to raise and lower the substrate before, during and/or after the deposition and/or plasma treatment processes. In an alternate embodiment, the substrate pedestal assembly 320 can include a carrier ring to raise and lower the substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal assembly including an electrostatic chuck can be found in commonly-assigned U.S. Pat. No. 8,840,754, which is incorporated herein by reference in its entirety. Details of a carrier ring for a substrate pedestal assembly can be found in commonly-assigned U.S. Pat. No. 6,860,965, which is incorporated herein by reference in its entirety. A backside gas supply 341 is operable to supply a heat transfer gas or purge gas through the substrate pedestal assembly 320 to a region below a lower surface of the substrate during processing. The substrate pedestal assembly 320 can include a lower RF electrode therein wherein the lower RF electrode is preferably grounded during processing, however in an alternate embodiment, the lower RF electrode may be supplied with RF energy during processing.

To process a substrate in the vacuum chamber 324 of the substrate plasma processing apparatus 300, gases are introduced from a gas source 362 into the vacuum chamber 324 via inlet 312 and showerhead assembly 314 wherein the gas is formed into plasma with RF energy such that a film may be deposited onto the upper surface of the substrate. In an embodiment, the gas source 362 can include multiple gas lines 310 that are connected to a heated manifold 308. The gases may be premixed or supplied separately to the chamber. Appropriate valving and mass flow control mechanisms are employed to ensure that the correct gases are delivered through the showerhead assembly 314 during substrate processing. During the processing, a backside heat transfer gas or purge gas is optionally supplied to a region below a lower surface of the substrate supported on the substrate pedestal assembly 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc.

In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a substrate 316 supported on an upper surface of the substrate pedestal assembly 320 and a plasma exposed surface of the showerhead assembly 314, pressure of the vacuum chamber 324, and other parameters of a particular process. Other computer programs stored on memory devices associated with the controller may be employed in some embodiments.

Typically there will be a user interface associated with controller 162. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the substrate, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

FIGS. 2A and 2B illustrate cross sections of embodiments of an edge plenum showerhead assembly (showerhead assembly) 314 as disclosed herein. Referring to both FIGS. 2A and 2B, the showerhead assembly 314 includes a face plate 240 and back plate 230. The back plate 230 has a first gas inlet 278 and a second gas inlet 279 through which respective first and second gases may be supplied to the showerhead assembly 314. The face plate 240 has a lower (bottom) wall 241 and an outer (side) wall 242 extending vertically upwardly from an outer periphery of the lower wall 241. The outer wall 242 can be sealed to an outer periphery 232 of the back plate 230 such that an inner plenum 250 and an edge plenum 255 are formed between the face plate 240 and the back plate 230. The outer periphery 232 of the back plate 230 is preferably metallurgically bonded (i.e. welded, brazed, diffusion bonded, or the like) to the outer wall 242 of the face plate 240. The outer wall 242 may be metallurgically bonded (i.e. welded, brazed, diffusion bonded, or the like) to the lower wall 241, or alternatively, the face plate 240 can be fabricated as a single piece.

The face plate 240 includes a first gas delivery region 214 in fluid communication with the first gas inlet 278 via the inner plenum 250 such that the first gas may be supplied therethrough during processing of a substrate and a second gas delivery region 215 in fluid communication with the second gas inlet 279 via the edge plenum 255 such that a second gas may be supplied therethrough during processing of a substrate. In an embodiment, as illustrated in FIG. 2A, the first and second gas delivery regions 214, 215 are formed in the lower wall 241 of the face plate 240 wherein the lower wall 241 is made of a metal material, a semiconducting material, or a ceramic material such that first and second gases supplied to the respective inner and edge plenums, which are in fluid communication with the lower wall 241, may be supplied therethrough. In an embodiment, the lower wall 241 can be formed of an aluminum material that is metallurgically bonded to the outer wall 242.

As shown in FIG. 2B, the first gas delivery region 214 can include a first group of gas injection holes 243 extending through an upper surface 245 and a lower surface 254 of the lower wall 241 and the second gas delivery region 215 can include a second group of gas injection holes 244 extending through an upper surface of the outer wall 242 and the lower surface 254 of the lower wall 241. The first gas inlet 278 of the back plate 230 is in fluid communication with the first group of gas injection holes 243 via the inner plenum 250, and the second gas inlet 279 is in fluid communication with the second group of gas injection holes 244 via the edge plenum 255. The inner and edge plenums 250, 255 are not in fluid communication with each other, and the first group of gas injection holes 243 and the second group of gas injection holes 244 are not spatially-interlaced.

In an embodiment, as shown in FIG. 2A, the second gas inlet 279 may be located in the outer periphery 232 of the back plate 230 such that a second gas may be supplied to the edge plenum 255. In an embodiment, the second gas may be supplied to the edge plenum 255 by two or more second gas inlets 279. In an alternate embodiment, as shown in FIG. 2B, the second gas inlet 279 may be located transversely inward of the outer periphery 232 of the back plate 230 wherein the back plate 230 includes at least one transversely extending gas passage 231 that is in fluid communication with the second gas inlet 279 and the edge plenum 255. Preferably, in this embodiment, the second gas inlet 279 is in fluid communication with the at least four transversely extending gas passages 231 via a diffuser 270 that is operable to reduce a pressure differential between gas flowing through each of the transversely extending gas passages 231 of the back plate 230 when gas is supplied thereto via the second gas inlet 279.

In an embodiment, as shown in FIG. 2A, the outer wall 242 of the face plate 240 can include an annular channel 285 in the upper surface thereof wherein the edge plenum 255 is formed between surfaces of the annular channel 285 and an outer lower surface 233 of the back plate 230. In an alternate embodiment, as shown in FIG. 2B, the outer wall 242 of the face plate 240 can include the annular channel 285 in the upper surface thereof and the back plate 230 can include an opposed annular channel 295 in the outer lower surface 233 thereof wherein the edge plenum 255 comprises an annular space between surfaces of the opposed annular channels 285, 295.

Figure 3A:
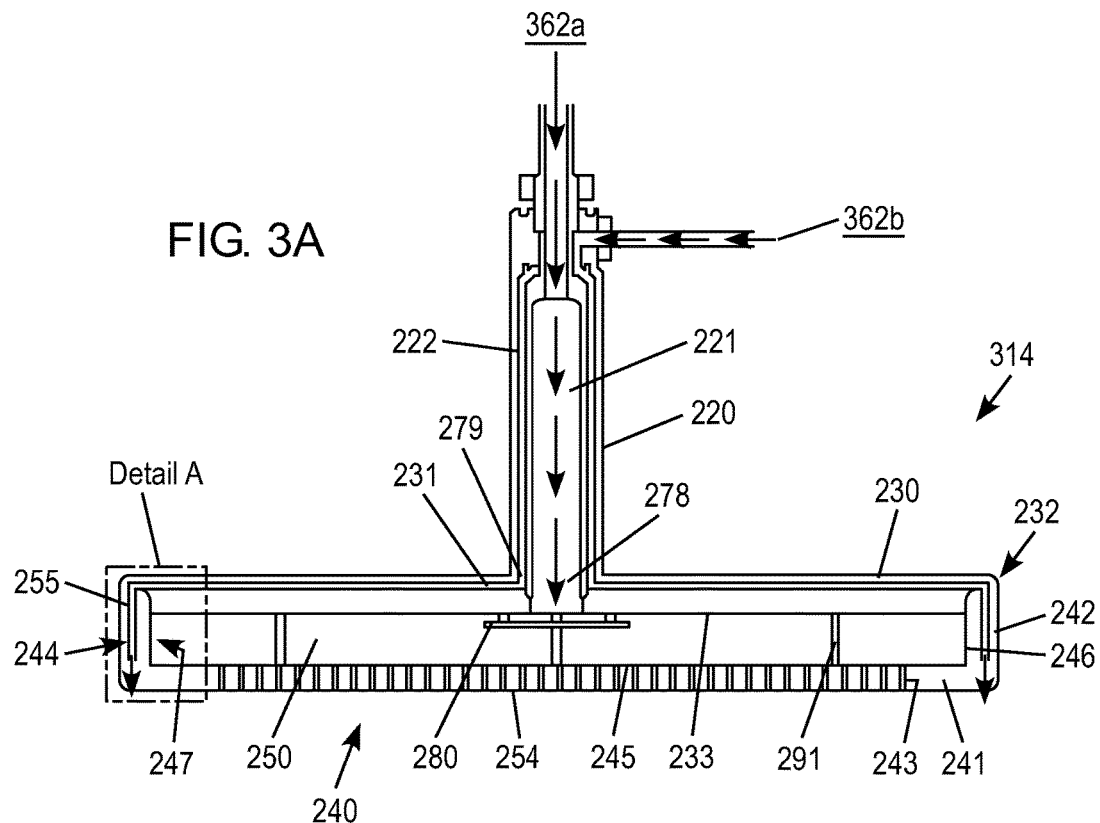
FIG. 3A illustrates an embodiment of a showerhead assembly of a deposition apparatus as disclosed herein.
Figure 3B:
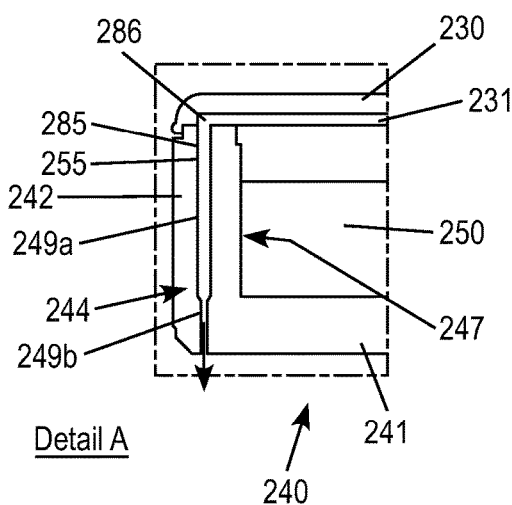
FIG. 3B shows detail A of FIG. 3A.
Figure 4:
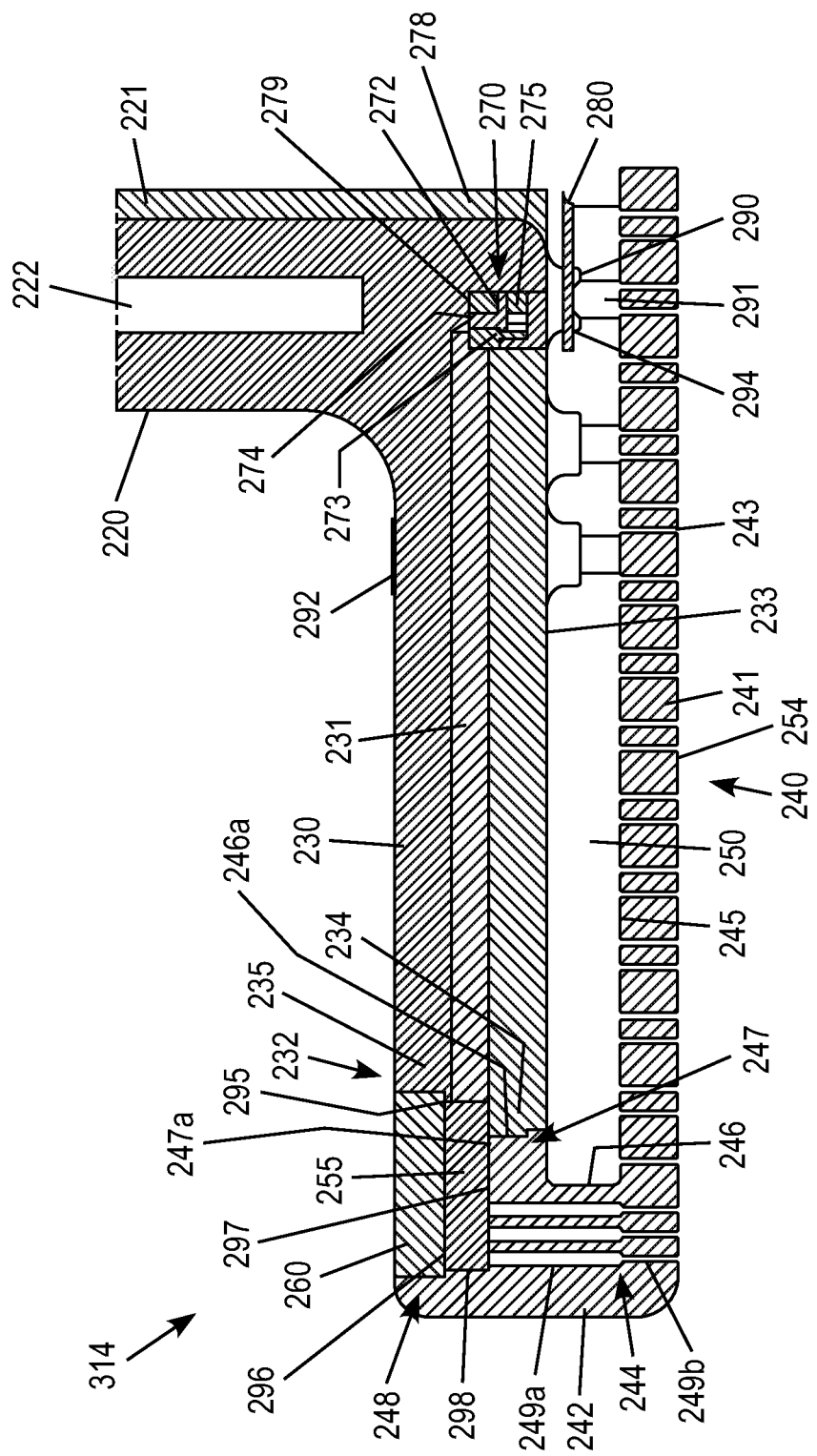
FIG. 4 illustrates an embodiment of a showerhead assembly of a deposition apparatus as disclosed herein.

FIGS. 3A, 3B, and 4 illustrate cross sections of embodiments of an edge plenum showerhead assembly (showerhead assembly) 314 as disclosed herein wherein the edge plenum showerhead assembly 314 includes a stem 220. The stem 220 of the showerhead assembly 314 has a first gas passage 221 extending vertically therethrough that is in fluid communication with the first gas inlet 278 of a back plate 230. In an embodiment, the stem 220 can also include a second gas passage 222 extending vertically therethrough that is in fluid communication with the second gas inlet 279 of the back plate 230. When the showerhead assembly 314 is mounted in a vacuum chamber of a deposition apparatus, the first gas passage 221 is in fluid communication with a first gas source 362a such that a first gas may be supplied through the showerhead assembly 314 to the vacuum chamber and the second gas passage 222 is in fluid communication with a second gas source 362b such that a second gas may be supplied through the showerhead assembly 314 to the vacuum chamber.

The back plate 230 extends transversely outward from a lower end of the stem 220. In an embodiment, the back plate 230 and the stem 220 can be formed as a monolithic piece, or alternatively, the back plate 230 may be metallurgically bonded (i.e. welded, brazed, or diffusion bonded) to the lower end of the stem 220 wherein the back plate 230 can include the first gas inlet 278 that is in fluid communication with the first gas passage 221 of the stem 220. The back plate 230 includes the at least one transversely extending gas passage 231 in fluid communication with the second gas passage 222 of the stem via the second gas inlet 279. Preferably, the back plate 230 includes at least four transversely extending gas passages 231, at least six transversely extending gas passages 231, at least eight transversely extending gas passages, or at least ten transversely extending gas passages 231. Preferably the transversely extending gas passages 231 are spaced equidistantly around the back plate 230.

The showerhead assembly 314 includes the face plate 240 including the lower wall 241 and the outer wall 242 that extends vertically upwardly from an outer periphery of the lower wall 241 wherein the outer wall includes an inner surface 247. The axial thickness of the outer wall 242 (i.e., height) is greater than the axial thickness of the lower wall 241 inward of the outer wall 242. Preferably, the axial thickness of the outer wall 242 is at least two times greater than the axial thickness of the lower wall 241 inward of the outer wall 242. The lower wall 241 preferably has a uniform axial thickness inward of the outer wall 242. The outer wall 242 is sealed to the outer periphery 232 of the back plate 230 such that the inner plenum 250 and the edge plenum 255 are formed between the face plate 240 and the back plate 230. Preferably the outer wall 242 is metallurgically bonded to the outer periphery 232 of the back plate 230. The face plate 240 includes the first group of gas injection holes 243 that extend through the lower surface 254 and the upper surface 245 of the lower wall 241 and the second group of gas injection holes 244 extending through the upper surface of the outer wall 242 and the lower surface 254 of the lower wall 241. The first gas passage 221 of the stem 220 is in fluid communication with the first group of gas injection holes 243 via the inner plenum 250, and the at least one transversely extending gas passage 231 is in fluid communication with the second group of gas injection holes 244 via the edge plenum 255. The inner plenum 250 is not in fluid communication with the edge plenum 255.

The inner plenum 250 is located between the outer lower surface 233 of the back plate 230, the upper surface 245 of the lower wall 241 of the face plate 240, and a lower inner surface 246 of the inner surface 247 of the outer wall 242 of the face plate 240. Referring to FIG. 3B, the outer wall 242 can include the annular channel 285 in the upper surface thereof wherein the edge plenum 255 is formed between surfaces of the annular channel 285 and the outer lower surface 233 of the back plate 230. In an alternate embodiment, the back plate 230 can include the opposed annular channel 286 in the outer lower surface 233 thereof wherein the edge plenum 255 comprises an annular space between surfaces of the opposed annular channels 285, 286.

In a further embodiment, as illustrated in FIG. 4, the inner surface 247 of the outer wall 242 can include an upper vertical surface 298, a lower vertical surface 246a, and a horizontal surface 297 extending therebetween. The edge plenum 255 is formed between the outer surface of the back plate 295, a lower surface of a cover plate 296, the horizontal surface 297, and the upper vertical surface 298. In an embodiment, the lower inner surface 246 of the outer wall 242 can be transversely outward of the lower vertical surface 246a so as to form a flange 247a that mates with and may be metallurgically bonded (e.g., welded) to a lower portion 234 of the back plate 230. The cover plate 260 can be sealed to an upper end 248 of the outer wall 242 and an upper portion 235 of the outer periphery 232 of the back plate 230. Preferably the cover plate 260 is metallurgically bonded (e.g., welded) to the upper end 248 of the outer wall 242 and the upper portion 235 of the outer periphery 232 of the back plate 230.

Referring back to FIGS. 3A, 3B, and 4, an upper portion 249a of each gas injection hole of the second group of gas injection holes 244 has a diameter greater than respective lower portions 249b. In an embodiment, the length of the respective lower portions 249b of each gas injection hole of the second group of gas injection holes 244 can be at least about the same as the length of each gas injection hole of the first group of gas injection holes 243. In an embodiment, the diameter of each of the respective lower portions 249b of each gas injection hole of the second group of gas injection holes 244 can be at least about the same as the diameter of each of the respective gas injection holes of the first group of gas injection holes 243.

Figure 12B:
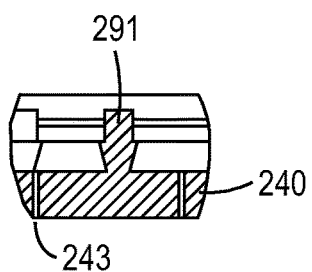
FIG. 12B is a blow-up of detail C in FIG. 12A.
Figure 12A:
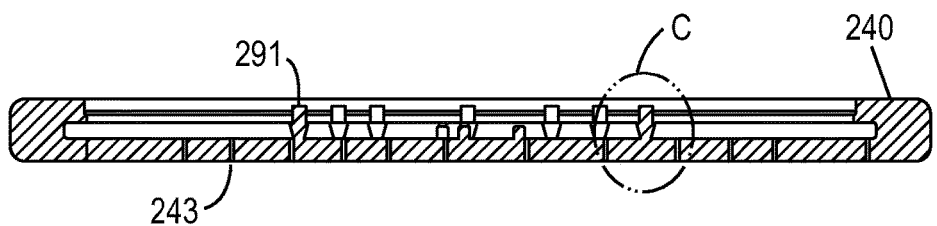
FIG. 12A is a cross sectional view of the face plate along the line B-B in FIG. 11

As shown in FIG. 12A, the face plate 240 preferably includes a plurality of posts 291 in the inner plenum 250 that extend vertically upwardly from the lower wall 241 wherein upper ends of the posts 291 are welded in corresponding openings 292 (see FIG. 4) of the back plate 230 in which the upper ends of the posts 291 are located. FIG. 12B is a blowup of detail C in FIG. 12A where it can be seen that the posts are smaller in diameter at the upper surface of the bottom wall of the face plate 240. The posts 291 strengthen the showerhead assembly and provide a path for heat conduction from the faceplate to the back plate. This helps to ensure a uniform faceplate temperature which is advantageous for process uniformity. In some embodiments, the posts may be tapered (smaller on the faceplate side and larger on the back plate side) to fit between closely-spaced faceplate holes, while still providing a large effective cross sectional area to facilitate heat conduction. For processing 300 mm wafers, the number of posts 291 can range from 2 to 30, preferably 10 to 20 posts circumferentially spaced apart in one or more annular zones located between the center and outer periphery of the face plate. A baffle 280 is preferably disposed in the inner plenum 250 of the showerhead assembly 314. The baffle 280 is operable to evenly distribute gas supplied to the showerhead assembly 314 throughout the inner plenum 250. The face plate 240, back plate 230, and stem 220 are preferably formed from an aluminum alloy such as 4047, 6061-T6, or other suitable material.

Referring now to FIG. 4, the back plate 230 can include the diffuser 270 metallurgically bonded (e.g., welded) in a recess in the outer lower surface 233 thereof. The diffuser 270 is in fluid communication with the second gas passage 222 of the stem 220 and the transversely extending gas passages 231 of the back plate 230. The diffuser 270 is operable to evenly supply gas from the second gas passage 222 of the stem 220 to the transversely extending gas passages 231 so as to reduce a pressure differential between gas flowing through each of the transversely extending gas passages 231 of the back plate 230 when gas is supplied thereto from the second gas passage 222 of the stem 220.

The diffuser 270 includes an upper surface having a group of inner gas openings 272 in fluid communication with the second gas passage 222 of the stem 220 and a group of outer gas openings 273 in fluid communication with the respective transversely extending gas passages 231 of the back plate 230. The group of inner gas openings 272 is separated from the group of outer gas openings 273 by a wall 274 that extends vertically upwardly from the upper surface of the diffuser. The group of inner gas openings 272 is in fluid communication with the group of outer gas openings 273 via a channel 275 of the diffuser 270 that is below the upper surface thereof. The group of inner gas openings 272 and the group of outer gas openings 273 are configured to reduce a pressure differential between gas flowing through each of the transversely extending gas passages 231 of the back plate 230 when gas is supplied thereto from the second gas passage 222 of the stem 220.

In an embodiment, the diffuser 270 can be a C-shaped ring. The space between opposed ends of the C-shaped ring are arranged to surround a portion of back plate 230 that includes a temperature probe therein. Preferably, the portion of the back plate 230 that includes the temperature probe therein forms a socket 290 that includes an upper portion of a post 291 is welded therein. The temperature probe is in thermal communication with the upper portion of the post 291 such that the temperature of the lower wall 241 may be measured. In an embodiment, the baffle 280 disposed in the inner plenum 250 can include a carve out 294 that surrounds the socket 290 of the back plate 230.

Figure 5A:
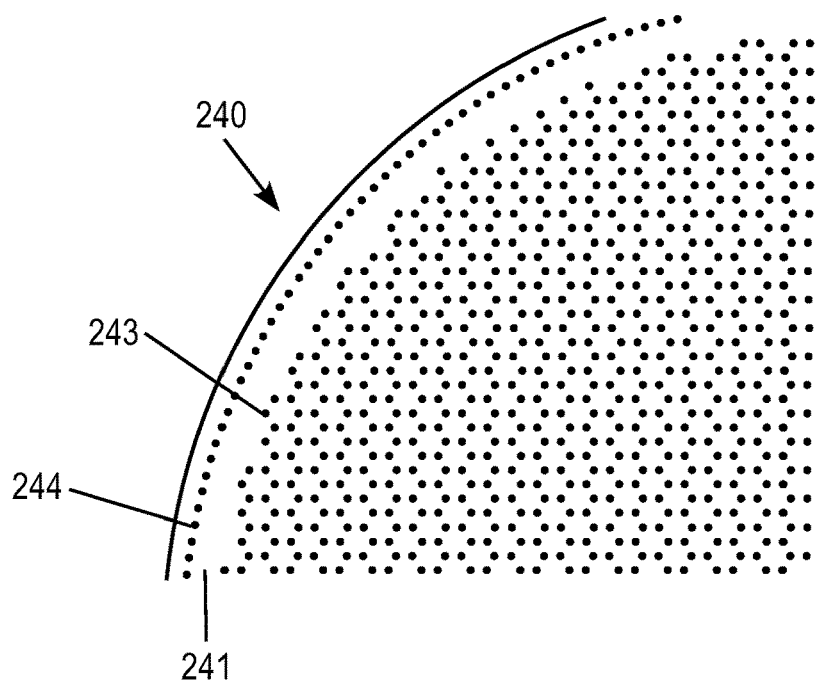
FIGS. 5A and 5B illustrate edge plenum hole patterns.
Figure 5B:
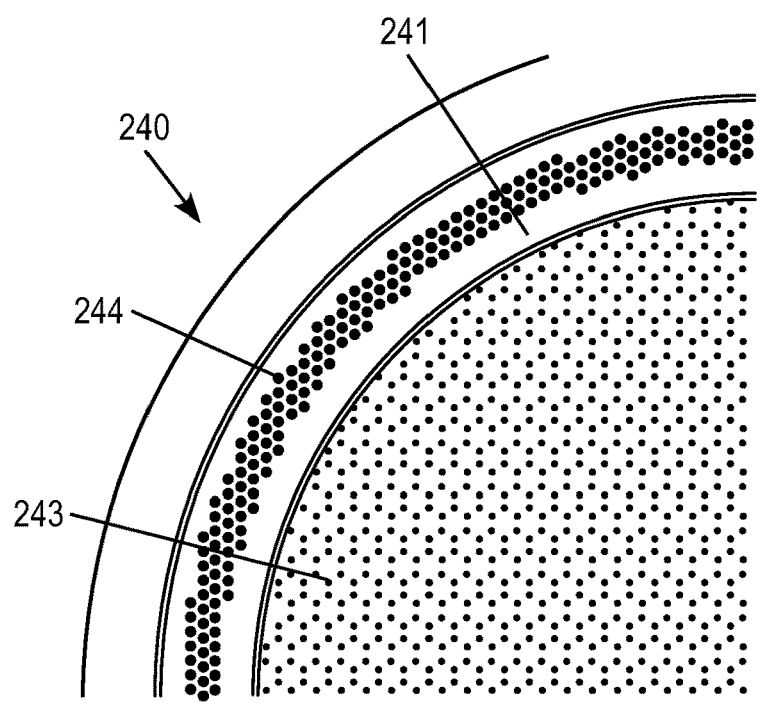
Figure 6:
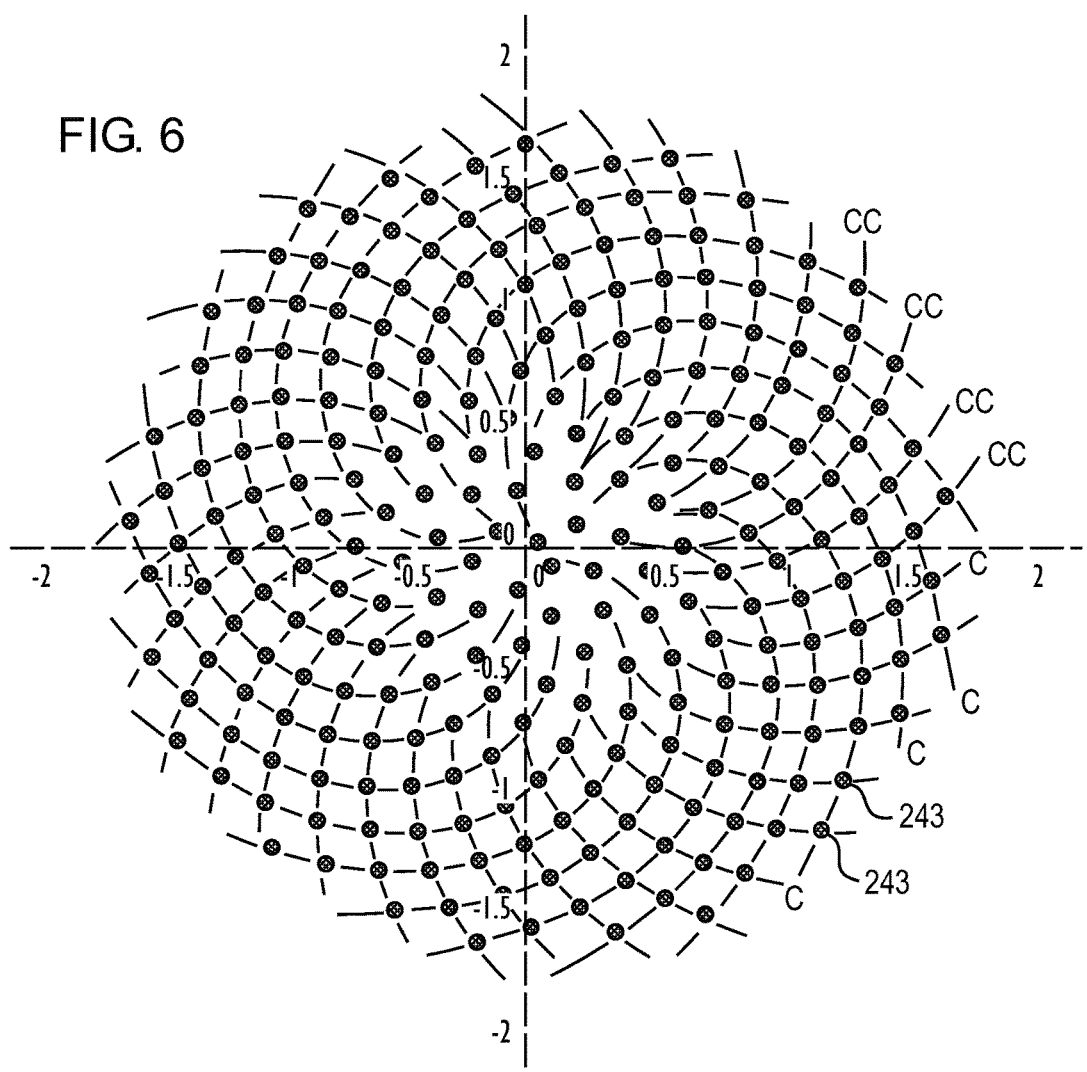
FIG. 6 illustrates a gas hole pattern in accordance with a preferred embodiment.

In an embodiment, the first group of gas injection holes 243 in the lower wall 241 of the face plate 240 may be arranged in an asymmetric pattern of holes wherein the holes are arranged in a non-radial and non-concentric pattern to avoid particle defect problems which can occur with symmetric hole patterns such as hexagonal, radial or concentric hole patterns. Thus, rather than a hole pattern of concentric circles, radial lines or a hexagonal pattern of holes as shown in FIGS. 5A-B, the first group of gas injection holes 243 in the lower wall 241 of the face plate 240 may be arranged an asymmetric pattern of holes wherein the holes are spaced apart along curved lines which intersect at locations outwardly of a center of the face plate, as shown in FIG. 6.

The second group of gas injection holes 244 may be arranged in one or more concentric rows. In an alternate embodiment, as illustrated in FIG. 5B, the second group of gas injection holes 244 can be arranged in a hexagonal pattern. The gas injection hole patterns, areal gas injection hole density, and dimensions of the gas injection holes of the first group of gas injection holes 243 and the second group of gas injection holes 244 can be predetermined for a given process to be performed. In an embodiment, the first group of gas injection holes 243 includes about 3,000-20,000 or more gas injection holes and the second group of gas injection holes 244 includes about 100 to about 2,000 or more gas injection holes.

Further disclosed herein is a method of depositing material on an upper surface of a substrate in a deposition apparatus. The method comprises supporting a substrate on an upper surface of a substrate pedestal assembly that is disposed in a vacuum chamber of the deposition apparatus. A first gas is supplied from a first gas source through a showerhead assembly to an inner processing zone of the vacuum chamber that is above an upper surface of the substrate. The first gas is supplied to the processing zone via an inner plenum of the showerhead assembly. The inner plenum is in fluid communication with a first group of gas injection holes that extend through an upper and lower surface of a lower wall of a face plate of the showerhead assembly such that the first gas can be supplied to the inner processing zone above the upper surface of the substrate.

A second gas is simultaneously supplied from a second gas source through the showerhead assembly to the processing zone of the vacuum chamber above the upper surface of the substrate. The second gas is supplied to an outer processing zone via an edge plenum of the showerhead assembly. The edge plenum is in fluid communication with a second group of gas injection holes that extend through an upper surface of an outer wall that extends vertically upward from an outer periphery of the lower wall and a lower surface of the lower wall of the face plate of the showerhead assembly such that the second gas can be supplied to an outer region of the outer processing zone above the upper surface of the substrate. The first or the first and second gases are energized into plasma wherein the plasma generated from the first gas is locally modified with the supply of the second gas and material is uniformly deposited on the upper surface of the substrate. Locally modifying the plasma generated from the first gas in the outer processing zone with the supply of the second gas preferably includes enhancing or suppressing the plasma generated in the outer processing zone by supplying one or more inert gases to the outer processing zone or supplying an inert tuning gas to the outer processing zone.

Also disclosed herein is a method of depositing material on an upper surface of a substrate in a deposition apparatus. The method comprises supporting a substrate on an upper surface of a substrate pedestal assembly that is disposed in a vacuum chamber of the deposition apparatus. A first gas is supplied to an inner zone of the vacuum chamber. The first gas is energized into plasma. A second gas is supplied to an edge zone of the vacuum chamber to modulate the plasma in the vicinity of an edge region of the substrate being processed so as to alter the rate of deposition of material on the edge region of the substrate. Preferably, the majority of the effect of the modulation of the plasma occurs within the outer 25% of the lateral extent of the substrate. More preferably, the plasma is modulated above the outer 20% of the lateral extent of the substrate. Modulation of the plasma includes altering an ion flux, energy, or species of the plasma and/or ions, neutrals, radials or components thereof.

Wafers processed using a showerhead having a hexagonal hole pattern are susceptible to having particle defects which lie along lines of symmetry of the hole pattern. The defect problem appears to be due to process gasses having a non-uniform flow caused by the hexagonal hole pattern. To minimize or avoid this defect problem, the hole pattern can be designed to (a) avoid lines of symmetry along a radial line, (b) arranged in a non-uniform pattern without large gaps between holes, and/or (c) the holes can be arranged not so close as to create heat dams/barriers.

In accordance with a preferred embodiment, the hole pattern is arranged according to Vogel's method to uniformly distribute holes on the faceplate of a showerhead. Vogel proposed a model for the elements in a sunflower head that follow the 2 equations: $r_n = c\sqrt{\theta_n}$ and $\theta_n = n*137.508°$. By using this method, holes on a showerhead can be distributed uniformly in an asymmetric hole pattern that is completely free of lines of symmetry (asymmetric). An exemplary hole pattern is shown in FIG. 6 wherein the holes are arranged in an asymmetrical pattern wherein the holes 243 are spaced apart along curved lines which extend outwardly in clockwise and counterclockwise directions. For example, dotted lines C illustrate clockwise curved lines and dotted lines CC illustrate counterclockwise curved lines. In an embodiment, the hole pattern has a number of clockwise curved lines (spirals) and a number of counterclockwise curved lines (spirals), wherein the number of clockwise spirals and the number of counterclockwise spirals are Fibonacci numbers or multiples of Fibonacci numbers. For example, the number of clockwise spirals and the number of counterclockwise spirals as a pair (m, n) can be (3, 5), (5, 8), (8, 13), (13, 21), (21, 34), (34, 55), (55, 89), (89, 144) or a multiple of such pairs. In another embodiment, the number of clockwise spirals and the number of counterclockwise spirals are any numbers in a ratio that converges on the golden ratio, wherein the golden ratio is equal to the sum of one plus the square root of five, divided by two $(1+\sqrt{5})/2$, which is approximately equal to 1.6180339887 (or approximately 1.6180). In a particular embodiment, the ratio of the clockwise spirals to the counterclockwise spirals is approximately equal to the golden ratio. Vogel's model, which is a type of "Fibonacci spiral", or a spiral in which the divergence angle between successive points is a fixed Fibonacci angle that approaches the golden angle, which is equal to 137.508°. A discussion of the Vogel method can be found in Vogel, H (1979) "A better way to construct the sunflower head", Mathematical Biosciences, 44 (44): 179-189. Doi.10.1016/0025-5564(79)90080-4. In addition, U.S. Published Application No. 2013/0260656 includes a discussion of Fibonacci and Vogel equations in connection with an aperture pattern of an abrasive article.

Figure 7A:
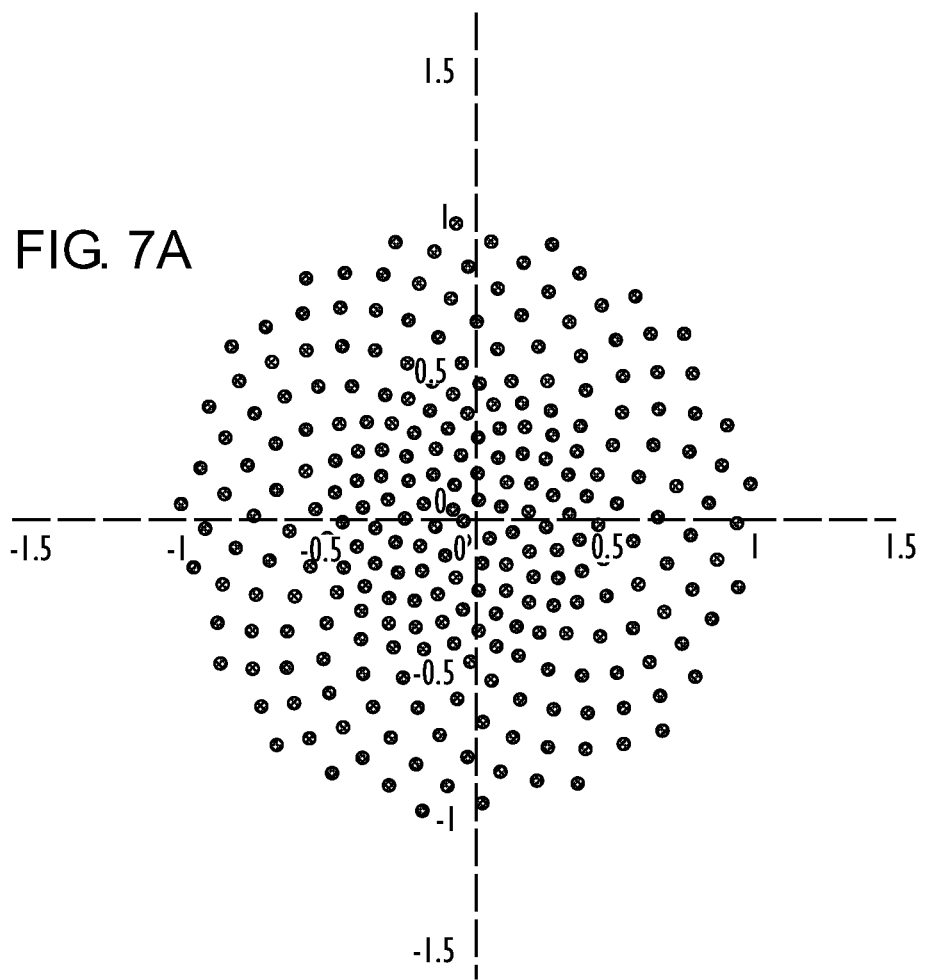
FIG. 7A illustrates a gas hole pattern having a greater density of holes in a central zone of the gas hole pattern and FIG. 7B illustrates a gas hole pattern having a greater density of holes in an outer zone of the gas hole pattern.
Figure 7B:
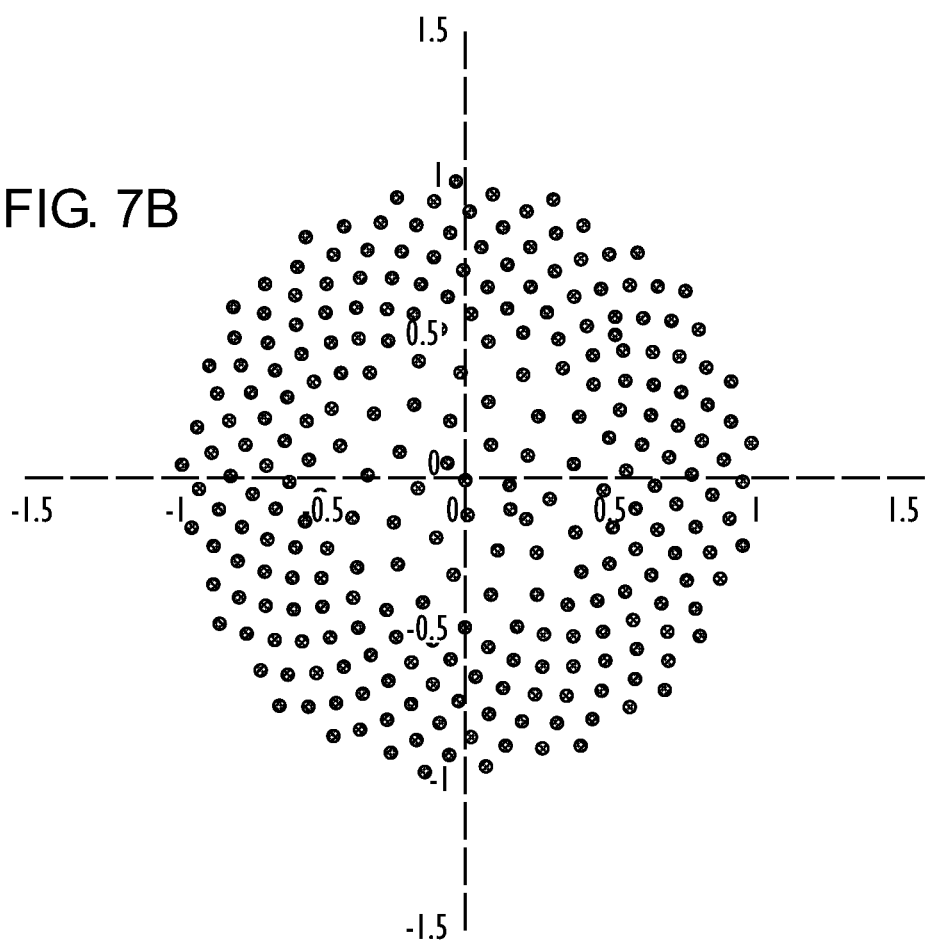

A further advantage to this method is that it can be readily adapted to provide variable hole density while still evenly distributing the holes in azimuthally. In this case, the equations become: $r_n = c\sqrt{r_{n-1}^2 + 1/\rho(r_n)}$ and $\theta = n*137.508°$ where $\rho(r_n)$ is the hole density as a function of radius. FIG. 7A shows this method applied to hole patterns with 2× the density in the center and FIG. 7B shows the hole pattern with 2× the density on the outside. It should be understood that these examples are just for illustration and that other variable density hole patterns can be used.

In showerheads having a hexagonal hole pattern, its six radial lines of symmetry may lead to defect patterns, as explained above. A second disadvantage is that the holes are not uniformly distributed—there is a large empty area in the center of each hex without any holes. Finally, a third disadvantage is that it cannot be readily adapted to allow variable hole density. In showerheads having a concentric hole pattern, while the pattern can be designed to avoid radial lines of symmetry, one disadvantage is that the holes are not evenly spaced. Generally the radial spacing and the azimuthal spacing are different. A second disadvantage is that if the azimuthal spacing is too tight, a heat dam (or barrier) can be formed. When this happens, thermal conductivity is reduced and the temperature of the showerhead varies radially.

The asymmetric hole pattern disclosed herein can solve the problems outlined above. First, the asymmetric hole pattern avoids radial lines of symmetry. In a preferred embodiment, the angle between any hole and its subsequent hole is about 137.5°. The number 137.5° is the golden angle; that is $360°/(360°-137.5°) = (360°-137.5°)/137.5° = \varphi$, the irrational golden ratio approximated by 1.618. This number is the hardest to approximate with a continued fraction; therefore holes are well dispersed with no lines of symmetry.

By way of counterexample, it can be shown that if a rational number (i/k) were used instead of φ, the result would be a hole pattern with k radial spokes. This hole pattern has constant density as a function of radius because the radial coordinates $r_n$ and $\theta_n$ of every hole follows the equations: $\theta_n = c1*n$ and $r_n = c2\sqrt{\theta_n}$ wherein c1 and c2 are constants and c1/2pi is an irrational number. Therefore, each section covers an annulus of equal area. In other words, each annulus of equal area has (in the limit) the same number of holes. The asymmetrical hole pattern can avoid the problem of heat dams as well. It can be seen from the equations used to construct the hole pattern that no two holes are at exactly the same radius. For that reason, the asymmetric hole pattern avoids having azimuthally closely spaced holes at the same radius which creates heat dams. Finally, the asymmetric hole pattern can solve the problem of needing to provide variable hole density which cannot be accomplished with the existing hexagonal hole pattern. Using $\theta_n = n*137.508°$ to generate the holes, any arbitrary hole density ρ(r) can be applied as shown in the equations above.

The preferred way to implement the asymmetrical hole pattern is to use the golden angle (approximately 137.5° degrees) as the angle between succeeding hole locations determined according to the equations discussed above. The angle 222.5° is equivalent. Other angles that are an irrational fraction of 360° could be used to create this type of asymmetric hole pattern, but it can be seen by plotting the hole locations that the results aren't as uniform as with the golden angle 137.5°. FIG. 8 illustrates 10 hole locations (n1, n2, n3, n4, n5, n6, n7, n8, n9, n10) wherein the angle between succeeding holes is the golden angle. Staring from hole n1 which is located a distance from the center point, lines connecting the holes become longer and extend counter-clockwise to the next hole such that an asymmetrical pattern of holes is formed. In manufacturing a face plate, the polar coordinates of the pattern of holes can be stored in a numerically controlled drilling machine which translates the drill to the polar coordinates of each hole and successively drills the holes.

Figure 9:
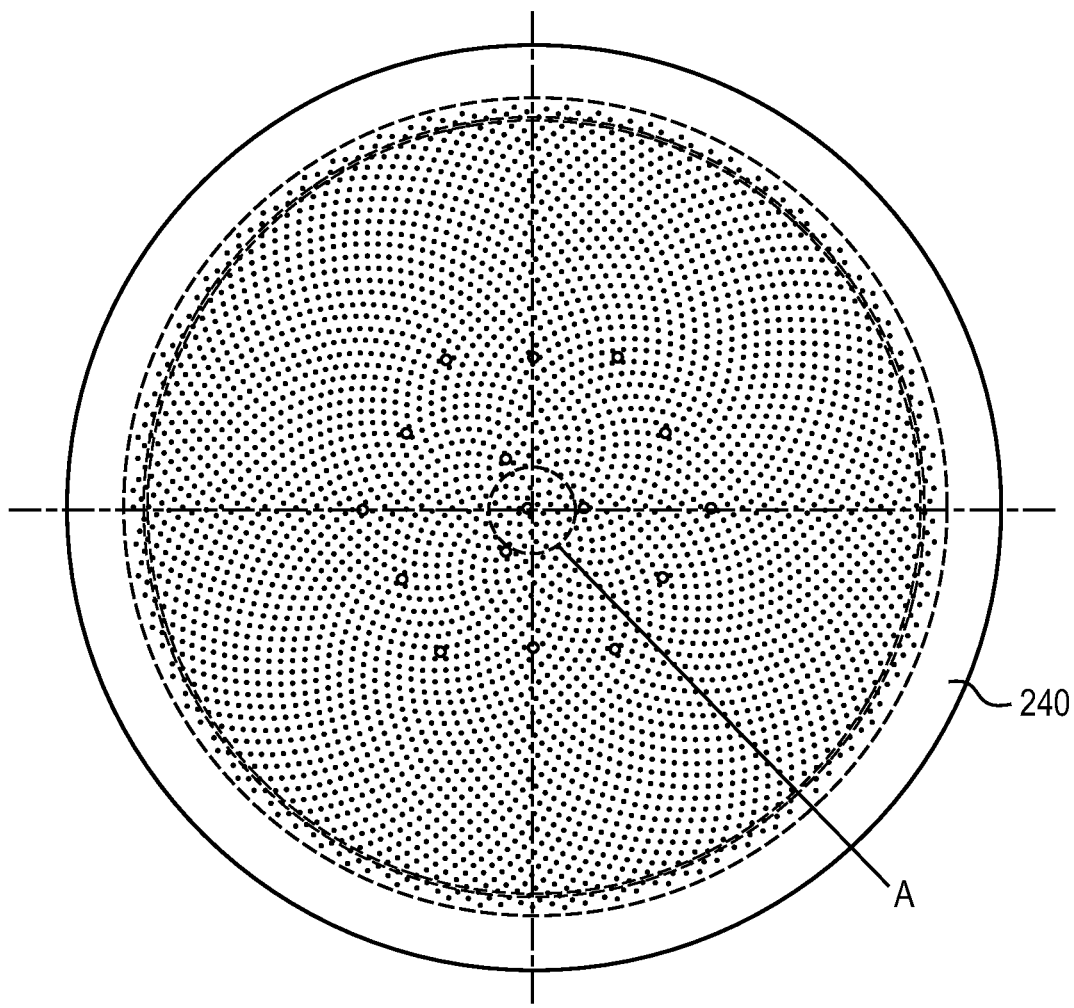
FIG. 9 is a bottom view of a face plate having an asymmetric gas hole pattern and FIG. 10 shows a portion of the face plate in FIG. 9 according to detail A.
Figure 10:
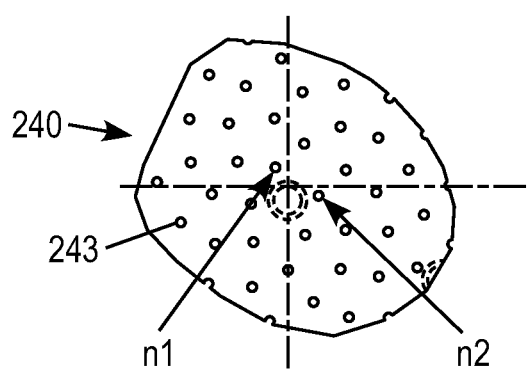

FIG. 9 illustrates a face plate 240 having an asymmetric hole pattern. FIG. 10 shows detail A from FIG. 9. As can be seen from FIGS. 9 and 10, the gas holes are located along curved lines which intersect at locations outwardly of a center of the face plate, the gas hole pattern having a non-radial and non-concentric distribution of gas holes extending through the face plate. As shown in FIG. 9, the gas holes are located at intersections of the curved lines wherein the curved lines extend outwardly in clockwise and counterclockwise directions around the center of the face plate and the clockwise lines intersect the counterclockwise lines at single locations along the counterclockwise lines. The distances between adjacent gas holes located along the clockwise curved lines are about equal to distances between adjacent gas holes located along the counterclockwise curved lines and a ratio of total number of the clockwise curved lines of gas holes to total number of counterclockwise curved lines of holes is about 1.6. At an outer periphery of the gas hole pattern there are less than 100 counterclockwise curved lines of gas holes and at least 140 clockwise curved lines of gas holes. In a preferred embodiment, the gas holes are arranged in a Vogel pattern and each of the gas holes has a diameter of about 0.04 inch. For processing 300 mm diameter semiconductor wafers, the pattern of gas holes can have at least 3000 gas holes such as 3000 to 5000 gas holes.

Figure 11:
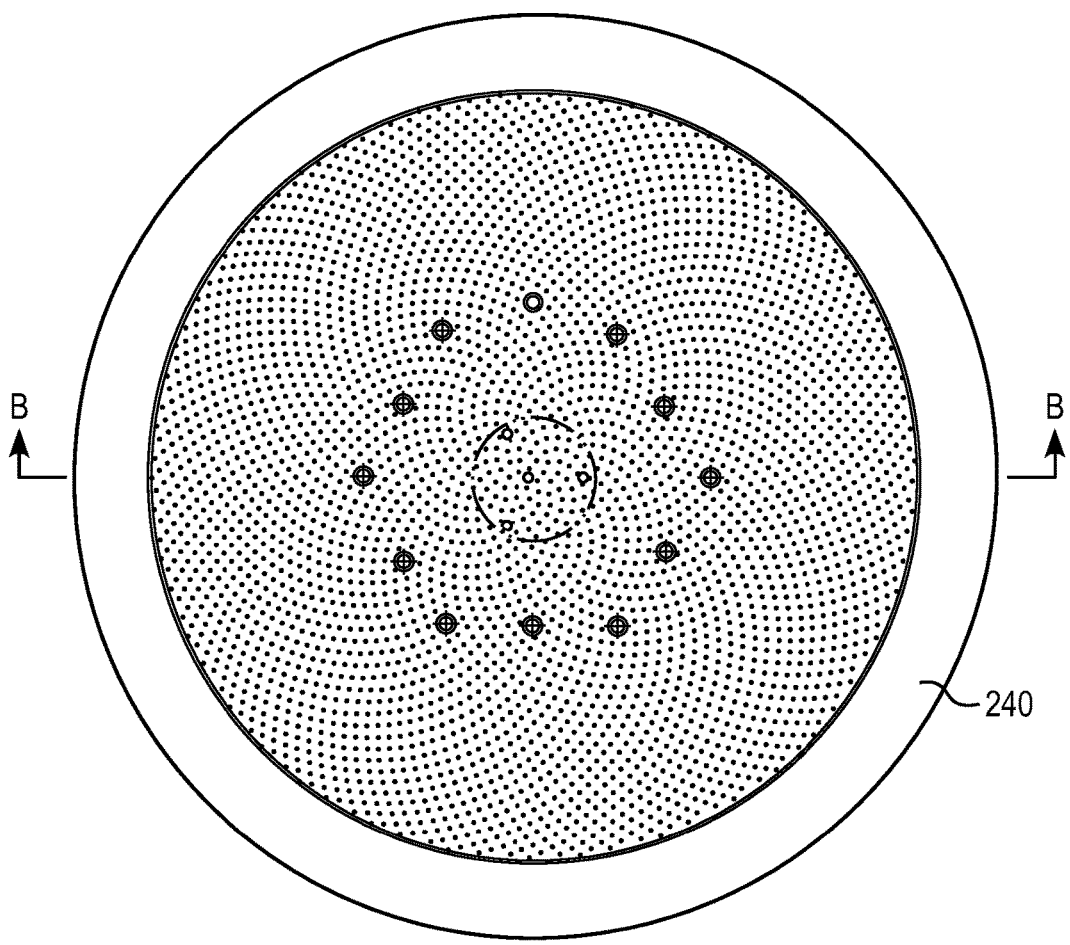
FIG. 11 shows a top view of the face plate shown in FIG. 9

FIG. 11 shows a top view of the face plate 240 and FIG. 12A shows a cross section view of the face plate along line B-B in FIG. 11. In this embodiment, the edge plenum is omitted and gas is supplied in a single plenum. The face plate 240 includes a bottom wall, side wall and top wall which attaches to a back plate and stem as described earlier.

Preferably, the density of gas holes is substantially the same from the center of the face plate to the outer periphery of the gas hole pattern. For example, the hole density can be about 20 to 50 holes per square inch. It is desirable to arrange holes in a pattern that is both uniform (evenly spaced, so there are no large gaps between holes) but not symmetric (meaning there are no radial or azimuthal lines of symmetry). Uniformity ensures that the film is evenly applied—no local areas where there is more or less film applied. It is preferred to avoid symmetry because radial (and possibly azimuthal) lines of symmetry set up symmetric fluid flow patterns which can cause particles to also lie in symmetric patterns.

In alternative embodiments, the density of the gas holes can be varied across the face plate. For example, the hole density can vary across the face plate such that (a) the density of the holes is at least 10% greater in an outer zone of the face plate than at an inner zone of the face plate or (b) the density of the holes is at least 10% greater in an inner zone of the face plate than at an outer zone of the face plate. However, the face plate can have a gradual change in density of holes from a central region to an outer region.

Embodiments disclosed herein have been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way.

What is claimed is:

1. A face plate of a showerhead useful in a deposition apparatus for processing semiconductor substrates, the face plate having an asymmetric gas hole pattern of gas holes, wherein the gas holes are spaced apart along curved lines which intersect at locations outwardly of a center of the face plate, the gas hole pattern having a non-radial and non-concentric distribution of gas holes extending through the face plate and the gas holes are arranged in a Vogel pattern.

2. The face plate of claim 1, wherein the gas holes are located at intersections of the curved lines wherein the curved lines extend outwardly in clockwise and counterclockwise directions around the center of the face plate, the clockwise lines intersecting the counterclockwise lines at single locations along the counterclockwise lines.

3. The face plate of claim 1, wherein the face plate includes a bottom wall containing the gas holes, a side wall extending upwardly from an outer periphery of the bottom wall, a top wall extending inwardly from an upper end of the side wall, and optional posts extending upwardly from an upper surface of the bottom wall, the posts being tapered with a smaller diameter at the upper surface of the bottom wall.

4. The face plate of claim 1, wherein a gas hole is located at the center of the face plate.

5. A face plate of a showerhead useful in a deposition apparatus for processing semiconductor substrates, the face plate having an asymmetric gas hole pattern of gas holes, wherein the gas holes are spaced apart along curved lines which intersect at locations outwardly of a center of the face plate, the gas hole pattern having a non-radial and non-concentric distribution of gas holes extending through the face plate, the gas holes located at intersections of the curved lines wherein the curved lines extend outwardly in clockwise and counterclockwise directions around the center of the face plate, the clockwise lines intersecting the counterclockwise lines at single locations along the counterclockwise lines, wherein (a) distances between adjacent gas holes located along the clockwise curved lines are about equal to distances between adjacent gas holes located along the counterclockwise curved lines or (b) the total number of clockwise curved lines of gas holes and the total number of counterclockwise curved lines of gas holes are consecutive members of the Fibonacci sequence.

6. A face plate of a showerhead useful in a deposition apparatus for processing semiconductor substrates, the face plate having an asymmetric gas hole pattern of gas holes, wherein the gas holes are spaced apart along curved lines which intersect at locations outwardly of a center of the face plate, the gas hole pattern having a non-radial and non-concentric distribution of gas holes extending through the face plate, the gas holes located at intersections of the curved lines wherein the curved lines extend outwardly in clockwise and counterclockwise directions around the center of the face plate, the clockwise lines intersecting the counterclockwise lines at single locations along the counterclockwise lines, wherein (a) a ratio of total number of the clockwise curved lines of gas holes to total number of counterclockwise curved lines of holes approaches the golden ratio (1.6180) or (b) a ratio of total number of the counterclockwise curved lines of gas holes to total number of clockwise curved lines of holes approaches the golden ratio (1.6180).

7. A face plate of a showerhead useful in a deposition apparatus for processing semiconductor substrates, the face plate having an asymmetric gas hole pattern of gas holes, wherein the gas holes are spaced apart along curved lines which intersect at locations outwardly of a center of the face plate, the gas hole pattern having a non-radial and non-concentric distribution of gas holes extending through the face plate, the gas holes located at intersections of the curved lines wherein the curved lines extend outwardly in clockwise and counterclockwise directions around the center of the face plate, the clockwise lines intersecting the counterclockwise lines at single locations along the counterclockwise lines, wherein (a) at an outer periphery of the gas hole pattern there are less than 100 counterclockwise curved lines of gas holes and at least 140 clockwise curved lines of gas holes or (b) at an outer periphery of the gas hole pattern there are less than 100 clockwise curved lines of gas holes and at least 140 counterclockwise curved lines of gas holes.

8. The face plate of claim 2, wherein each of the gas holes has a diameter of about 0.04 inch.

9. The face plate of claim 1, wherein the pattern of gas holes has at least 3000 gas holes.

10. The face plate of claim 1, wherein the gas hole pattern has about the same number of gas holes per unit area from the center of the face plate to an outer periphery of the gas hole pattern.

11. A face plate of a showerhead useful in a deposition apparatus for processing semiconductor substrates, the face plate having an asymmetric gas hole pattern of gas holes, wherein the gas holes are spaced apart along curved lines which intersect at locations outwardly of a center of the face plate, the gas hole pattern having a non-radial and non-concentric distribution of gas holes extending through the face plate, the gas holes are located at intersections of the curved lines wherein the curved lines extend outwardly in clockwise and counterclockwise directions around the center of the face plate, the clockwise lines intersecting the counterclockwise lines at single locations along the counterclockwise lines, wherein each of the gas holes has a radial position defined by polar coordinates $r_n$ and $\theta_n$ according to the formulas:

$$\theta = c1*n \text{ and } r_n = c2\sqrt{\theta_n}$$

wherein c1 and c2 are constants, and c1/2pi is an irrational number.

12. The face plate of claim 11, where c1 is the golden angle (2.39996 radians or 137.508°).

13. The face plate of claim 1, wherein the gas hole pattern has no lines of symmetry and the holes are evenly distributed.

14. A deposition apparatus for processing a substrate, the deposition apparatus comprising:
   a vacuum chamber including a processing zone in which a substrate may be processed;
   at least one gas source in fluid communication with the vacuum chamber, the at least one gas source operable to supply a process gas into the vacuum chamber during processing;
   a showerhead assembly including the face plate of claim 1 and back plate, the back plate including at least one gas inlet in fluid communication with the at least one gas source, the gas holes in the face plate distributing the process gas into the vacuum chamber during processing; and
   a substrate pedestal assembly configured to support a substrate on an upper surface thereof when a substrate is processed in the deposition apparatus.

15. The deposition apparatus of claim 14, wherein the showerhead assembly further comprises a stem wherein the back plate extends transversely outward from a lower end of the stem, the stem having at least one gas passage extending vertically therethrough in fluid communication with the at least one gas source.

16. The deposition apparatus of claim 14, wherein an inner plenum is located between a lower surface of the back plate, an upper surface of the face plate, and a lower inner surface of an outer wall of the face plate.

17. A method of depositing material on an upper surface of a substrate in the deposition apparatus of claim 14, the method comprising:
   supporting a substrate on the upper surface of the substrate pedestal assembly disposed in the vacuum chamber of the deposition apparatus;
   supplying at least one gas from at least one gas source through the gas holes in the face plate;
   energizing the at least one gas into plasma; and
   uniformly depositing material on an upper surface of the substrate.

18. A method of manufacturing the face plate of claim 1, comprising:
   drilling the gas holes such that the angle between each hole and a radially adjacent gas hole is about 137.5°.

19. The method of claim 18, wherein the face plate is a metal plate.

20. The method of claim 19, wherein the metal plate comprises an aluminum alloy plate and the gas holes are drilled with a numerically controlled drilling machine.

* * * * *